(12) United States Patent
Tsai et al.

(10) Patent No.: US 9,397,205 B1
(45) Date of Patent: Jul. 19, 2016

(54) SEMICONDUCTOR DEVICE

(71) Applicant: Macronix International Co., Ltd., Hsinchu (TW)

(72) Inventors: Ying-Chieh Tsai, Chiayi (TW); Wing-Chor Chan, Hsinchu (TW); Shyi-Yuan Wu, Hsinchu (TW); Jeng Gong, Taichung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/806,233

(22) Filed: Jul. 22, 2015

(51) Int. Cl.
| H01L 29/739 | (2006.01) |
| H01L 29/10  | (2006.01) |
| H01L 29/06  | (2006.01) |
| H01L 29/08  | (2006.01) |
| H01L 29/66  | (2006.01) |

(52) U.S. Cl.
CPC ........ *H01L 29/7393* (2013.01); *H01L 29/0696* (2013.01); *H01L 29/083* (2013.01); *H01L 29/0834* (2013.01); *H01L 29/1095* (2013.01)

(58) Field of Classification Search
CPC ............ H01L 29/0634; H01L 29/7393; H01L 29/1095; H01L 29/083; H01L 29/0834; H01L 29/0839; H01L 2924/13055; H01L 2027/11861; H01L 29/0696; H01L 29/66325
See application file for complete search history.

(56) References Cited

U.S. PATENT DOCUMENTS

2015/0357405 A1*  12/2015  Ueda ............... H01L 29/0619
                                                      257/77

* cited by examiner

*Primary Examiner* — Thanhha Pham
(74) *Attorney, Agent, or Firm* — Finnegan, Henderson, Farabow, Garrett & Dunner LLP (57) ABSTRACT

A semiconductor device includes a substrate, a first doped well disposed in the substrate, a second doped well disposed in the substrate adjacent to a first side of the first doped well, a buffer region disposed in the first doped well adjacent to a second and opposite side of the first doped well, a gate structure disposed above the first side of the first doped well and extending along a first horizontal direction, a first contact region disposed in the buffer region toward the second side of the first doped well, a second contact region disposed in the buffer region adjacent to the first contact region, and a doped region disposed in the buffer region under the first contact region.

14 Claims, 8 Drawing Sheets

SEMICONDUCTOR DEVICE

FIELD OF THE DISCLOSURE

The present disclosure relates to a semiconductor device.

BACKGROUND

Lateral insulated gate bipolar transistor (LIGBT) devices are widely used in high voltage power integrated circuits (ICs) for applications such as switched-mode power supply (SMPS), lighting, motor control, or plasma display drivers. Design goals of the LIGBT devices include achieving high breakdown voltage and low specific on-resistance, and shrinking the feature size of the LIGBT devices without degrading device characteristics.

SUMMARY

According to an embodiment of the disclosure, a semiconductor device includes a substrate having a first conductivity type, a first doped well having a second conductivity type and disposed in the substrate, a second doped well having the first conductivity type and disposed in the substrate adjacent to a first side of the first doped well, a buffer region having the second conductivity type and disposed in the first doped well adjacent to a second and opposite side of the first doped well, a gate structure disposed above the first side of the first doped well and extending along a first horizontal direction, a first contact region having the first conductivity type and disposed in the buffer region toward the second side of the first doped well, a second contact region having the second conductivity type and disposed in the buffer region adjacent to the first contact region, and a doped region having the second conductivity type and disposed in the buffer region under the first contact region.

According to another embodiment of the disclosure, a semiconductor device includes a substrate having a first conductivity type, a first doped well having a second conductivity type and disposed in the substrate, a second doped well having the first conductivity type and disposed in the substrate adjacent to a first side of the first doped well, a buffer region having the second conductivity type and disposed in the first doped well adjacent to a second and opposite side of the first doped well, a gate structure disposed above the first side of the first doped well and extending along a first horizontal direction, a first contact region having the first conductivity type and disposed in the buffer region toward the second side of the first doped well, a second contact region having the second conductivity type and disposed in the buffer region adjacent to the first contact region, a plurality of first doped regions having the second conductivity type and disposed in the buffer region, and a plurality of second doped regions having the first conductivity type and disposed in the buffer region. The first doped regions and the second doped regions are alternately arranged along the first horizontal direction.

According to still another embodiment of the disclosure, a semiconductor device includes a substrate having a first conductivity type, a first doped well having a second conductivity type and disposed in the substrate, a second doped well having the first conductivity type and disposed in the substrate adjacent to a first side of the first doped well, a buffer region having the second conductivity type and disposed in the first doped well adjacent to a second and opposite side of the first doped well, a gate structure disposed above the first side of the first doped well and extending along a first horizontal direction, a first contact region having the first conductivity type and disposed in the buffer region toward the second side of the first doped well, a second contact region having the second conductivity type and disposed in the buffer region adjacent to the first contact region, the second contact region having a comb shape including a first portion extending along the first horizontal direction and a plurality of second portions spaced apart from each other and contiguous with the first portion, and the first contact region including a plurality of portions disposed between the second portions of the second contact region, and a doped region having the second conductivity type and disposed in the buffer region under the first contact region.

The accompanying drawings, which are incorporated in and constitute a part of this application, illustrate disclosed embodiments and, together with the description, serve to explain the disclosed embodiments.

DETAILED DESCRIPTION

Reference will now be made in detail to the present embodiments, examples of which are illustrated in the accompanying drawings. Wherever possible, the same reference numbers will be used throughout the drawings to refer to the same or like parts.

Figure 1:
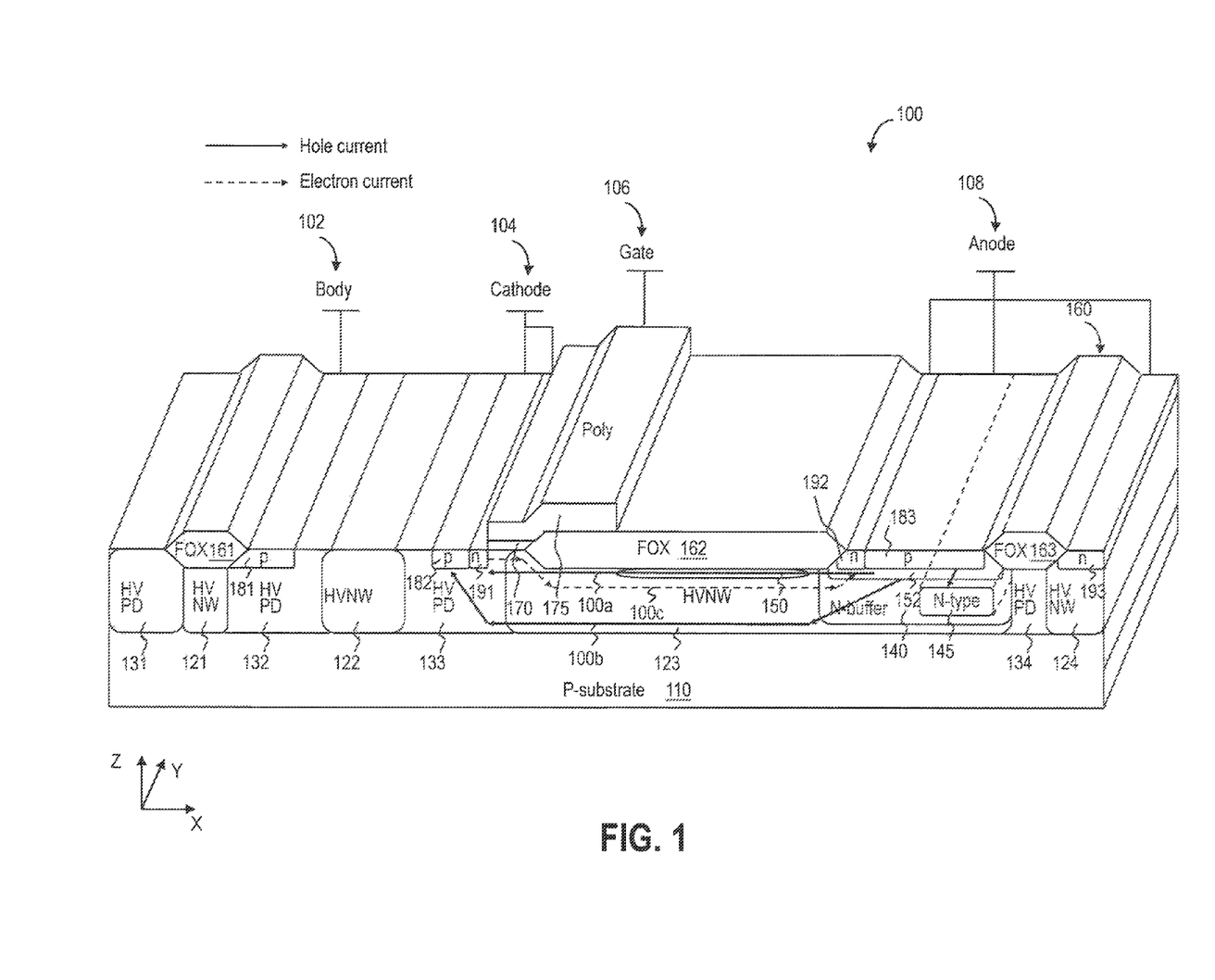
FIG. 1 is a cross-sectional view of a lateral insulated gate bipolar transistor (LIGBT), according to an illustrated embodiment.

FIG. 1 is a cross-sectional view of a lateral insulated gate bipolar transistor (LIGBT) 100, according to an illustrated embodiment. LIGBT 100 is provided on a P-type substrate 110. Substrate 110 can be formed of a P-type bulk silicon material, a P-type silicon epitaxial layer, or a P-type silicon-on-insulator (SOI) material. Substrate 110 can be doped with a P-type dopant such as, for example, boron (B).

A first high-voltage N-well (HVNW) 121, a second HVNW 122, a third HVNW 123, and a fourth HVNW 124 are disposed in substrate 110 sequentially from left to right along a horizontal direction as viewed in FIG. 1, i.e., along the X-direction illustrated in FIG. 1. Each one of first through fourth HVNWs 121-124 extends along the Y-direction illustrated in FIG. 1. First through fourth HVNWs 121-124 are spaced apart from each other. First through fourth HVNWs 121-124 can be doped with an N-type dopant such as, for example, phosphorus (P), in a doping concentration of, for example, $1\times10^{12}$ to $5\times10^{13}$ cm$^{-2}$.

A first high-voltage P-doped region (HVPD) 131, a second HVPD 132, a third HVPD 133, and a fourth HVPD 134 are disposed in substrate 110 sequentially from left to right along the horizontal direction as viewed in FIG. 1, i.e., along the X-direction illustrated in FIG. 1. First HVPD 131 is disposed adjacent to a left-side edge of first HVNW 121 as viewed in FIG. 1. Second HVPD 132 is disposed adjacent to and between first HVNW 121 and second HVNW 122. Third HVPD 133 is disposed adjacent to and between second HVNW 122 and third HVNW 123. Fourth HVPD 134 is disposed adjacent to and between third HVNW 123 and fourth HVNW 124. Each one of first through fourth HVPDs 131-134 extends along the Y-direction illustrated in FIG. 1. First through fourth HVPVs 131-134 can be doped with a P-type dopant such as, for example, boron (B), in a doping concentration of, for example, $5 \times 10^{12}$ to $5 \times 10^{13}$ cm$^{-2}$. The doping concentration of first through fourth HVPDs 131-134 is higher than the doping concentration of substrate 110.

An N-buffer region 140 is disposed in third HVNW 123, adjacent to a right-side edge of third HVNW 123 as viewed in FIG. 1. N-buffer region 140 extends along the Y-direction illustrated in FIG. 1. The depth of N-buffer region 140 is less than the depth of third HVNW 123. N-buffer region 140 can be doped with an N-type dopant such as, for example, phosphorus (P) or arsenic (As), in a doping concentration of, for example, $1 \times 10^{13}$ to $1 \times 10^{14}$ cm$^{-2}$. The doping concentration of N-buffer region 140 is higher than the doping concentration of third HVNW 123.

An N-type doped region 145 is disposed in N-buffer region 140. N-type doped region 145 is spaced apart and close to a right-side edge of N-buffer region 140 as viewed in FIG. 1. N-type doped region 145 extends along the Y-direction illustrated in FIG. 1. N-type doped region 145 can be doped with an N-type dopant such as, for example, phosphorus (P) or arsenic (As), in a doping concentration of, for example, $5 \times 10^{13}$ to $5 \times 10^{14}$ cm$^{-2}$. The doping concentration of N-type doped region 145 is higher than the doping concentration of N-buffer region 140.

A P-top layer 150 is disposed in third HVNW 123, between a left-side edge of third HVNW 123 and N-buffer region 140 as viewed in FIG. 1. P-top layer 150 is spaced apart from N-buffer region 140. A P-body layer 152 is disposed in N-buffer region 140. P-body layer 152 is spaced apart from a left-side edge and the right-side edge of N-buffer region 140 as viewed in FIG. 1. P-body layer 152 is spaced apart from N-type doped region 145. P-top layer 150 can be doped with a P-type dopant such as, for example, boron (B), in a doping concentration of, for example, $1 \times 10^{12}$ to $1 \times 10^{13}$ cm$^{-2}$ P-body layer 152 can be doped with a P-type dopant such as, for example, boron (B), in a doping concentration of, for example, $1 \times 10^{12}$ to $5 \times 10^{13}$ cm$^{-2}$.

An isolation layer 160 is disposed above substrate 110. Isolation layer 160 can be formed of a field oxide (FOX), or other suitable insulating structures, such as a shallow trench isolation (STI). Hereinafter, isolation layer 160 is referred to as FOX layer 160. FOX layer 160 includes first through third FOX portions 161-163 each extending along the Y-direction illustrated in FIG. 1. First FOX portion 161 is disposed above and covers the entire first HVNW 121. Second FOX portion 162 is disposed above a left-side portion of third HVNW 123 and covers the entire P-top layer 150. Third FOX portion 163 is disposed above and covers the entire fourth HVPD 134.

A gate oxide layer 170 is disposed above substrate 110, and covers a left-side edge portion of third HVNW 123 and a right-side edge portion of third HVPD 133 as viewed in FIG. 1. A gate layer 175 formed of, e.g., polysilicon (denoted as "poly" in FIG. 1) is disposed above substrate 110, and covers gate oxide layer 170 and a left-side edge portion of second FOX portion 162 as viewed in FIG. 1. Both of gate oxide layer 170 and gate layer 175 extend along the Y-direction illustrated in FIG. 1. Gate oxide layer 170 and gate layer 175 constitute a gate structure.

A first P+-region 181 is disposed in second HVPD 132. A second P+-region 182 and a first N+-region 191 are disposed in third HVPD 133 and adjacent to each other. A second N+-region 192 and a third P+-region 183 are disposed in N-buffer region 140, adjacent to each other, and above P-body layer 152. A third N+-region 193 is disposed in fourth HVNW 124. Each one of first through third P+-regions 181-183 and first through third N+-regions 191-193 extend along the Y-direction. First through third P+-regions 181-183 can be doped with a P-type dopant such as, for example, boron (B), in a doping concentration of, for example, $1 \times 10^{15}$ to $5 \times 10^{15}$ cm$^{-2}$. First through third N+-regions 191-193 can be doped with an N-type dopant such as, for example, phosphorus (P) or arsenic (As), in a doping concentration of, for example, $1 \times 10^{15}$ to $5 \times 10^{15}$ cm$^{-2}$.

Figure 2:
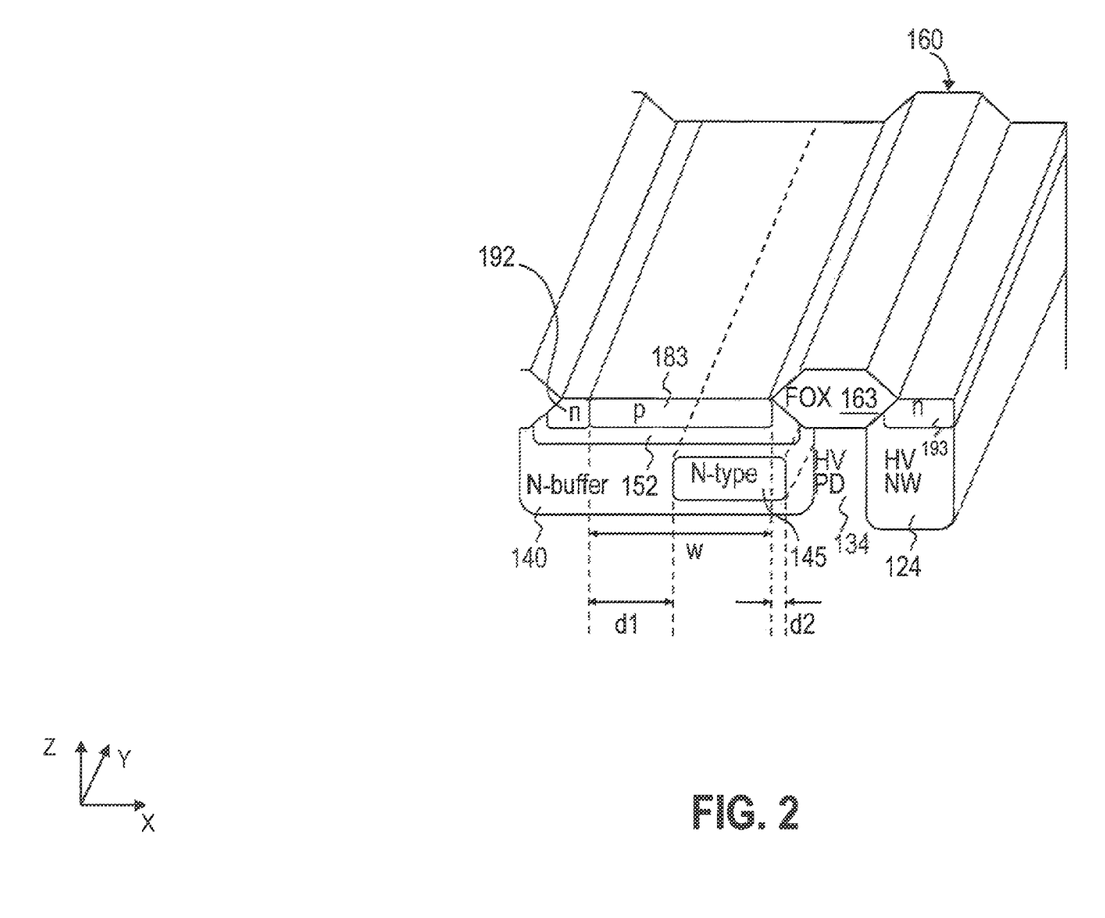
FIG. 2 is an enlarged cross-sectional view of the LIGBT of FIG. 1, according to an illustrated embodiment.

FIG. 2 is an enlarged partial cross-sectional view of LIGBT 100, according to an illustrated embodiment. As illustrated in FIG. 2, a width of third P+-region 183 along the X-direction, i.e., a distance between a left-side edge and a right-side edge of third P+-region 183, is denoted a "w". A distance between the left-side edge of third P+-region 183 and a left-side edge of N-type doped region 145 is denoted as "d1". A distance between the right-side edge of third P+-region 183 and a right-side edge of N-type doped region 145 is denoted as "d2". Distance d1 can be about 30% to 70% of width w of third P+-region 183. Distance d2 can be equal to or larger than 0. That is, the right-side edge of N-type doped region 145 extends beyond the right-side edge of third P+-region 183 toward the right-side edge of N-buffer region 140.

Referring back to FIG. 1, during operation of LIGBT 100, first P+-region 181 is electrically connected to a body electrode 102 to receive a reference voltage such as 0V, or be grounded. Second P+-region 182 and first N+-region 191 are electrically connected to a cathode electrode 104 to receive a cathode voltage. Gate layer 175 is electrically connected to a gate electrode 106 to receive a gate voltage. Second N+-region 192, third P+-region 183, and third N+-region 193 are connected to an anode electrode 108 to receive an anode voltage.

When the anode voltage at anode electrode 108 is higher than the cathode voltage at cathode electrode 104, a first hole current 100a flows from third P+-region 183, passes through P-body layer 152 and P-top layer 150, and reaches second P+-region 182. A second hole current 100b flows from third P+-region 183, passes through P-body layer 152, N-buffer region 140, third HVNW 123, and third HVPD 133, and reaches second P+-region 182. An electron current 100c flows from first N+-region 191, passes through third HVNW 123 and N-buffer region 140, and reaches second region 192.

If N-buffer region 140 does not include N-type doped region 145, a hole current will flow vertically downwards, as viewed in FIG. 1, from third P+-region 183 to substrate 110. Such hole current will decrease an anode current (i.e., from anode electrode 108 to cathode electrode 104) of LIGBT 100 and increases the on-resistance of LIGBT 100. On the other hand, in LIGBT 100 of the illustrated embodiment, N-type doped region 145 functions as a barrier that prevents the hole current from flowing from third P+-region 183 to substrate 110. As a result, the anode current of LIGBT 100 will not decrease and the on-resistance of LIGBT 100 will not increase.

Figure 3:
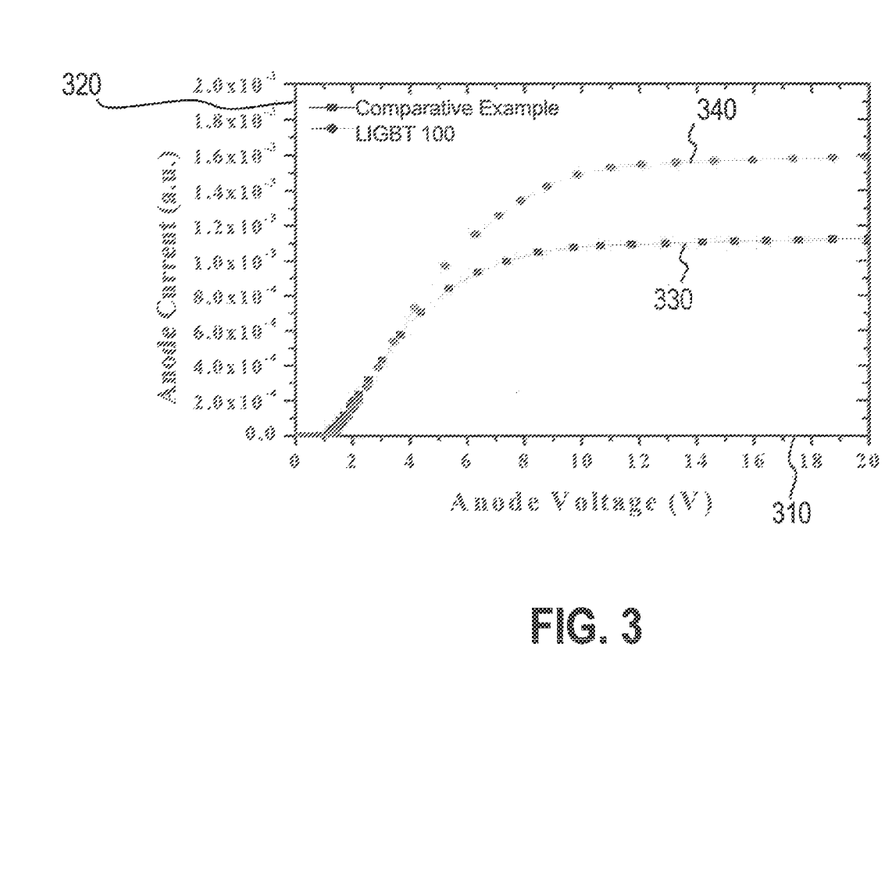
FIG. 3 is a graph showing anode current-voltage characteristics of an LIGBT of a comparative example and the LIGBT of FIG. 1.

FIG. 3 is a graph showing anode current-voltage characteristics of an LIGBT of a comparative example and LIGBT 100 of FIG. 1. The data shown in FIG. 3 is obtained by computer simulation. The LIGBT of the comparative example has a structure similar to that of LIGBT 100 of FIG. 1, except that the LIGBT of the comparative example does not include N-type doped region 145.

In the graph of FIG. 3, abscissa 310 represents an anode voltage (i.e., the voltage applied at anode electrode 108) in volts V, and ordinate 320 represents an anode current (i.e., the current measured at anode electrode 108) in arbitrary units (a.u.). During the measurements of the anode current, the anode voltage is varied from 0V to 20V. A gate voltage applied to gate electrode 106 is about 5V to 20V. A cathode voltage applied to cathode electrode 104 is 0V. Body electrode 102 is grounded. Curve 330 represents the anode current of the LIGBT of the comparative example. Curve 340 represents the anode current of LIGBT 100 of FIG. 1.

As shown in FIG. 3, the anode current of LIGBT 100 of FIG. 1 is higher than the anode current of the LIGBT of the comparative example when the anode voltage rises above 4V. This is because N-type doped region 145 of LIGBT 100 functions as a barrier to suppress the hole current from third P+-region 183 to substrate 100, thereby increasing the anode current.

Figure 4:
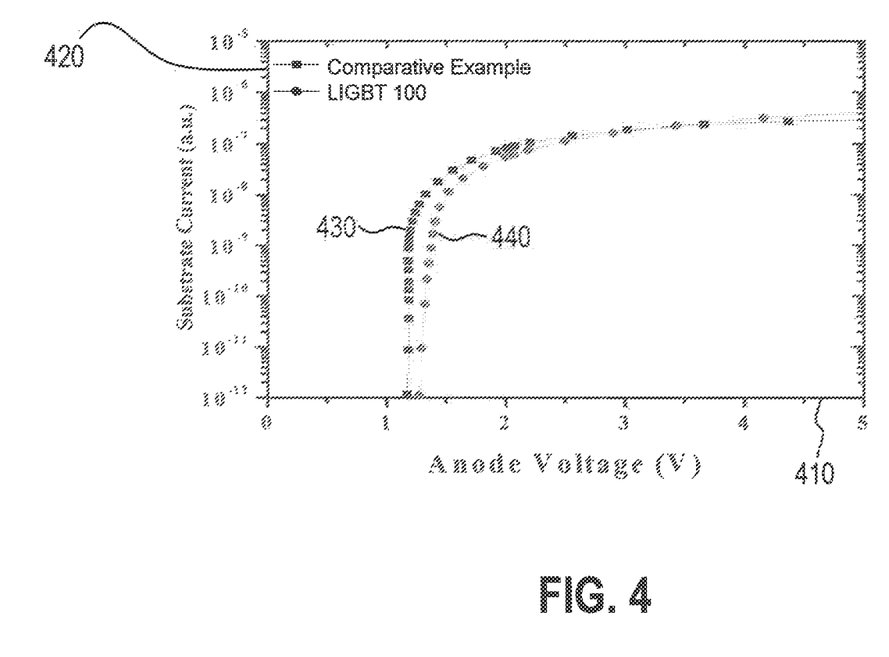
FIG. 4 is a graph showing substrate current versus anode voltage characteristics of the LIGBT of the comparative example and the LIGBT of FIG. 1.

FIG. 4 is a graph showing substrate current versus anode voltage characteristics of the LIGBT of the comparative example and LIGBT 100 of FIG. 1, obtained by computer simulation. In the graph of FIG. 4, abscissa 410 represents an anode voltage in volts V, and ordinate 420 represents a substrate current (i.e., the current measured at body electrode 102) in arbitrary units (a.u.). During the measurements of the substrate current, the anode voltage is varied from 0V to 5V. A gate voltage applied to gate electrode 106 is about 5V to 20V. A cathode voltage applied to cathode electrode 104 is 0V. Body electrode 102 is grounded. Curve 430 represents the substrate current of the LIGBT of the comparative example. Curve 440 represents the substrate current of LIGBT 100 of FIG. 1.

As shown in FIG. 4, the substrate current of LIGBT 100 of FIG. 1 is lower than the substrate current of the LIGBT of the comparative example when the anode voltage is lower than 3V. This is because N-type doped region 145 of LIGBT 100 suppresses the hole current from third P+-region 183 to substrate 100, thereby decreasing the substrate current.

Figure 5:
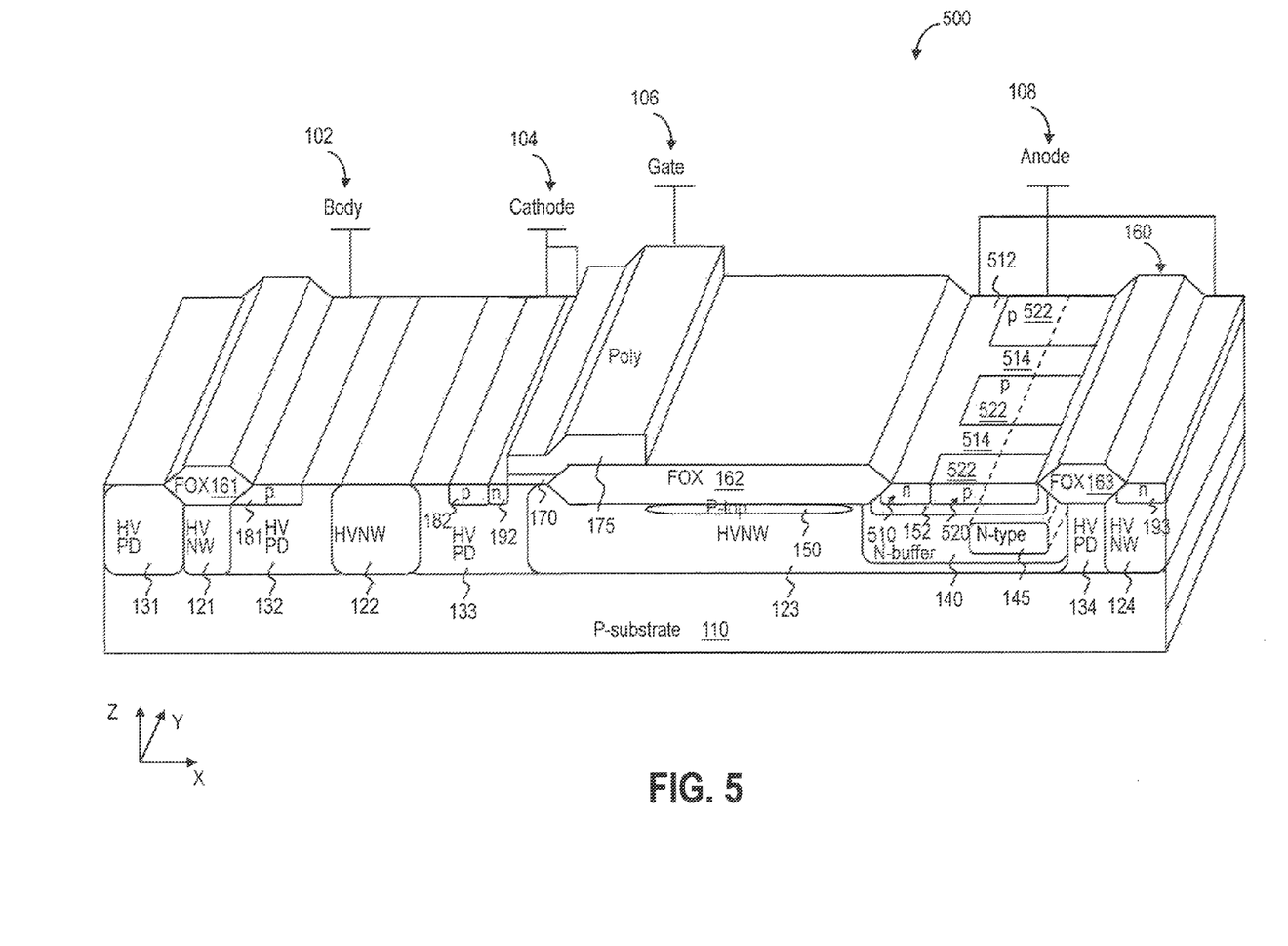
FIG. 5 is cross-sectional view of an LIGBT, according to an illustrated embodiment.

FIG. 5 is cross-sectional view of an LIGBT 500, according to an illustrated embodiment. LIGBT 500 has a structure similar to that of LIGBT 100 illustrated in FIG. 1, except that LIGBT 500 includes an N+-region 510 and a P+-region 520, instead of second N+-region 192 and third P+-region 183 of LIGBT 100.

As illustrated in FIG. 5, N+-region 510 has a comb shape including a first N+-portion 512 extending along the Y-direction illustrated in FIG. 5, and a plurality of second N+-portions 514 extending along the X-direction illustrated in FIG. 5 and contiguous with first N+-portion 512. The plurality of second N+-portions 514 are spaced apart from each other along the Y-direction. P+-region 520 includes a plurality of P+-portions 522 disposed along the Y-direction illustrated in FIG. 5, between the plurality of second N+-portions 514. That is, the plurality of P+-portions 522 and the plurality of second N+-portions 514 are alternately arranged along the Y-direction. N+-region 510 and P+-region 520 including all of P+-portions 522 are electrically connected to anode electrode 108 to receive the anode voltage.

Each one of the plurality of P+-portions 522 forms a PNP transistor together with N-buffer region 140 and P-type substrate 110. When the anode voltage at anode electrode 108 is higher than the cathode voltage at cathode electrode 104, a hole current flows from each one of the plurality of P+-portions 522 to P-substrate 110. If the area of each of the plurality of P+-portions 522 along an X-Y plane parallel to the X-direction and the Y-direction illustrated in FIG. 5 decreases, the total hole current that flows to P-substrate 110 will decrease. Therefore, compared to a scenario in which P+-region 183 extends along the Y-direction, as illustrated in FIG. 1, the total hole current that flows to P-substrate 110 decreases, the total anode current that flows from N+-region 510 to N+-region 192 increases, and thus the on-resistance of LIGBT 500 decreases. The total area of the plurality of P+-portions 522 and the area of N+-region 510 along an X-Y plane parallel to the X-direction and the Y-direction illustrated in FIG. 5 can be adjusted to achieve a desired ratio between the total hole current and the total electron current that flow between cathode 104 and anode 108.

Figure 6:
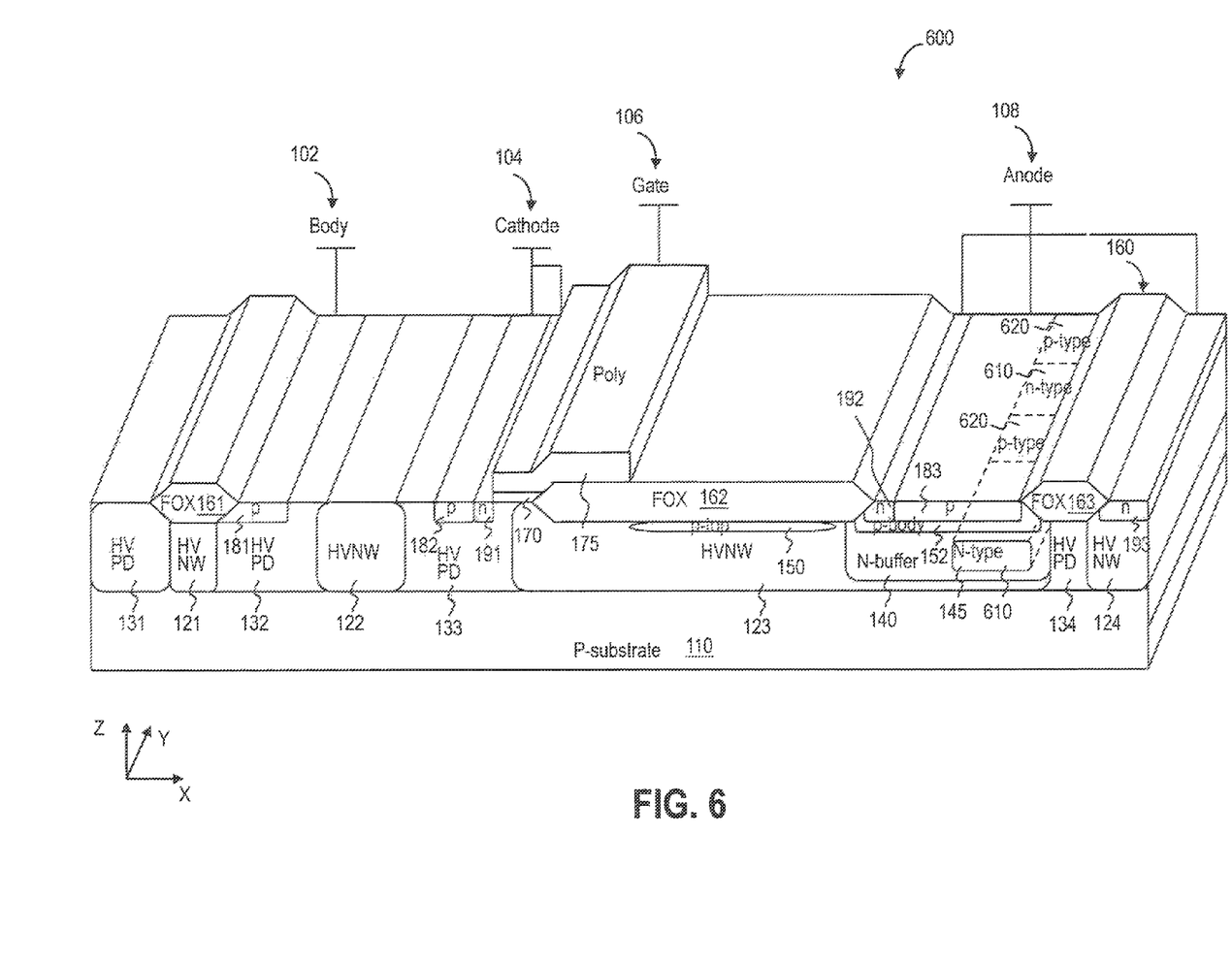
FIG. 6 is cross-sectional view of an LIGBT, according to an illustrated embodiment.

FIG. 6 is cross-sectional view of an LIGBT 600, according to an illustrated embodiment. LIGBT 600 has a structure similar to that of LIGBT 100 illustrated in FIG. 1, except that LIGBT 600 includes a plurality of N-type doped regions 610 and a plurality of P-type doped regions 620 instead of N-type doped region 145 of LIGBT 100. As illustrated in FIG. 6, the plurality of N-type doped regions 610 and the plurality of P-type doped regions 620 are disposed in N-buffer region 140 and below P-body layer 152. The plurality of N-type doped regions 610 and the plurality of P-type doped regions 620 are alternately disposed along the Y-direction illustrated in FIG. 6. The plurality of N-type doped regions 610 can be doped with an N-type dopant such as, for example, phosphorus (P) or arsenic (As), in a doping concentration of, for example, $5 \times 10$ to $5 \times 10^{14}$ cm$^{-2}$. The plurality of P-type doped regions 620 can be doped with a P-type dopant such as, for example, boron (B), in a doping concentration of, for example, $1 \times 10^{15}$ to $5 \times 10^{15}$ cm$^{-2}$. The doping concentration of P-type doped regions 620 can be the same as the doping concentration of third P+-region 183.

P-type doped regions 620 function similarly to P+-portions 522 in LIGBT 500 illustrated in FIG. 5. That is, P-type doped regions 620 function to decrease the total hole current that flows to P-substrate 110, and thus reduce the on-resistance of LIGBT 600. The sizes of P-type doped regions 620 and N-type doped regions 610 can be adjusted to achieve a desired ratio between the total hole current and the total electron current that flow between cathode 104 and anode 108.

Figure 7:
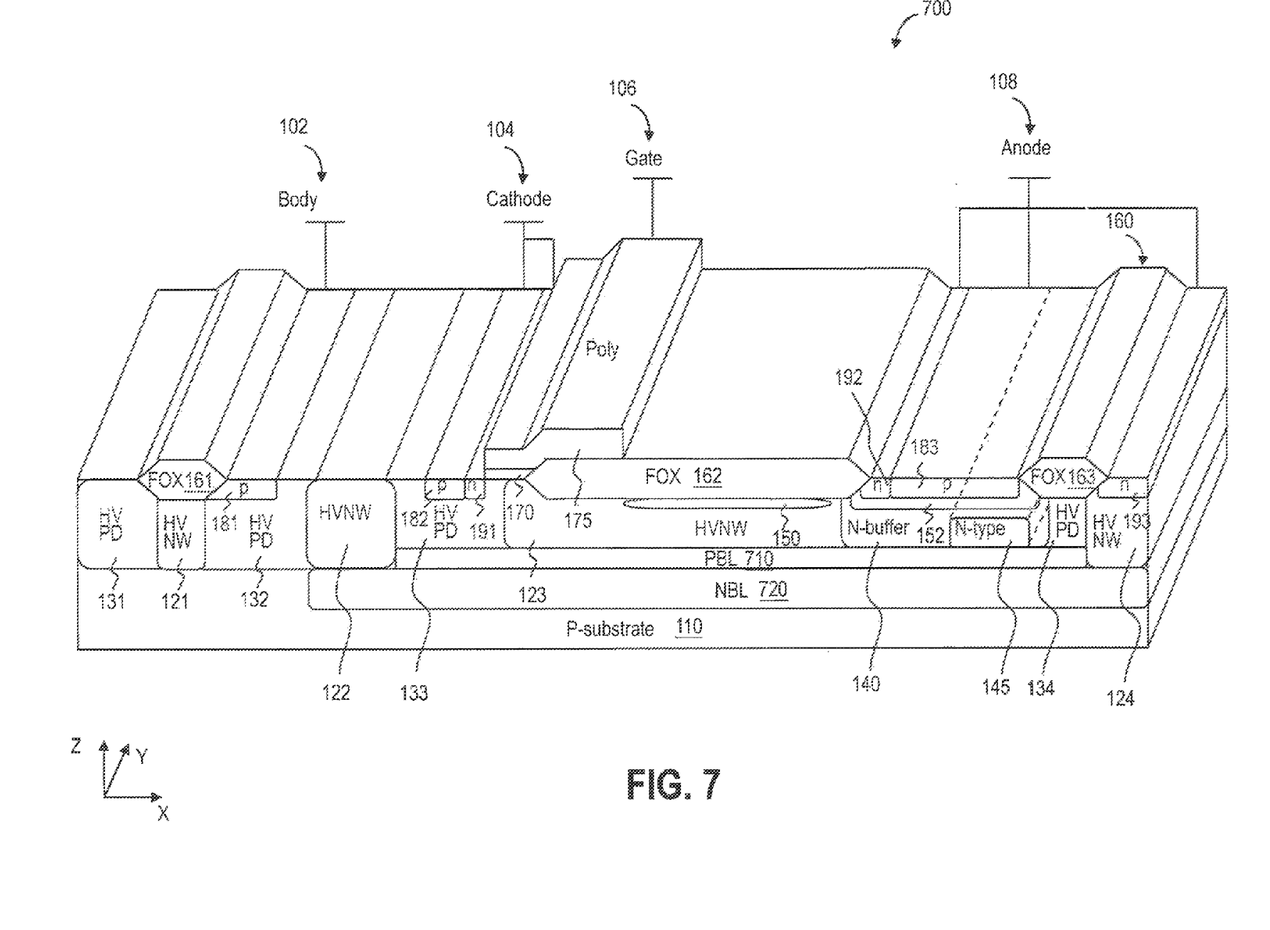
FIG. 7 is cross-sectional view of an LIGBT, according to an illustrated embodiment.

FIG. 7 is cross-sectional view of an LIGBT 700, according to an illustrated embodiment. LIGBT 700 has a structure similar to that of LIGBT 100 illustrated in FIG. 1, except that LIGBT 700 additionally includes a P-type buried layer (PBL) 710 and an N-type buried layer (NBL) 720. As illustrated in FIG. 7, PBL 710 is disposed under and connects to the bottoms of third HVPD 133, third HVNW 123, and fourth HVPD 134. NBL 720 is disposed under and connects to the bottoms of second HVNW 122, PBL 710, and fourth HVNW 124, PBL 710 and NBL 720 further prevent the hole current from flowing into substrate 110.

Figure 8:
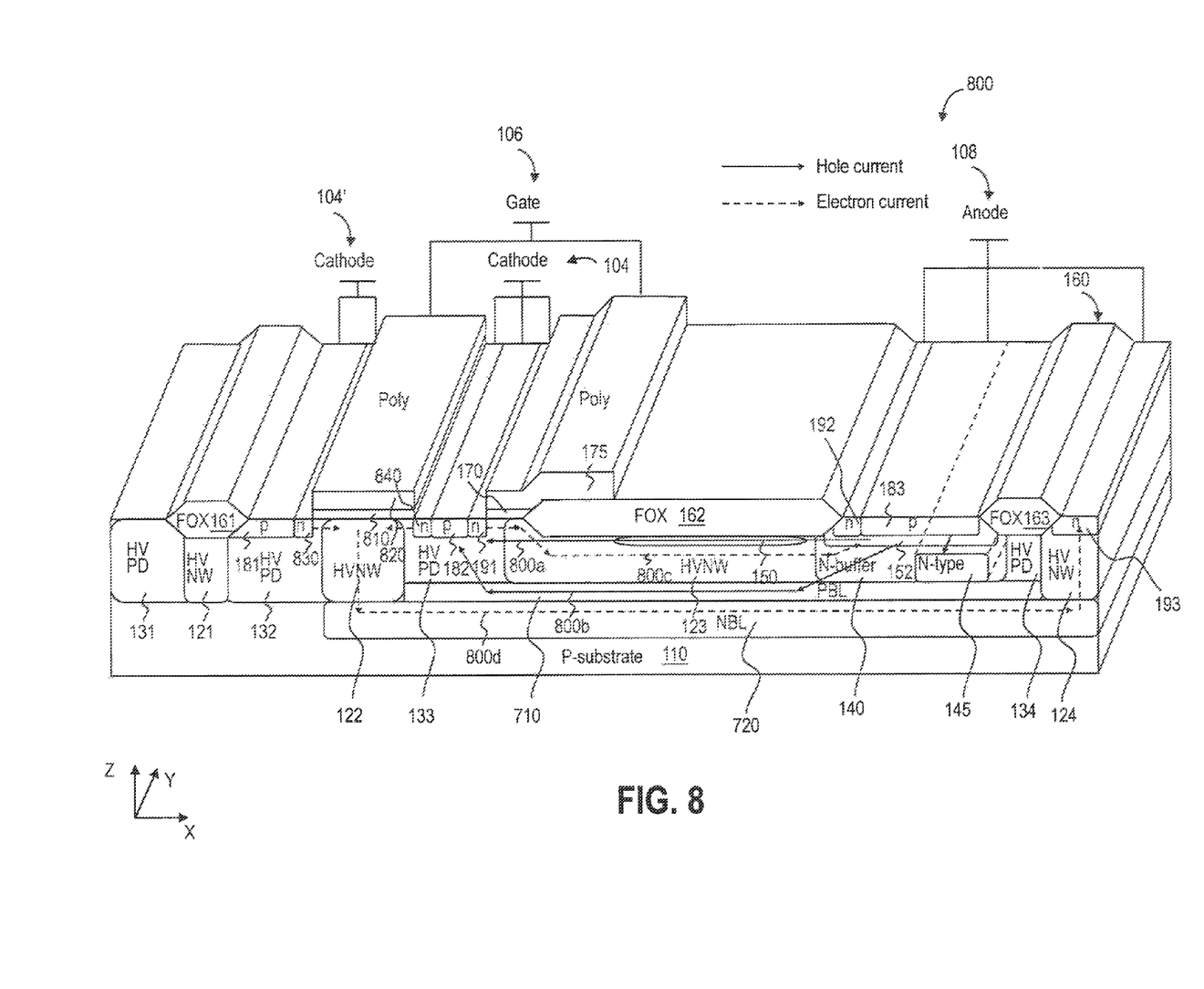
FIG. 8 is cross-sectional view of an LIGBT, according to an illustrated embodiment.

FIG. 8 is cross-sectional view of an LIGBT 800, according to an illustrated embodiment. LIGBT 800 has a structure similar to that of LIGBT 700 illustrated in FIG. 7, except that LIGBT 800 additionally includes a second gate structure including a second gate oxide layer 810, where gate oxide layer 170 is also referred to as first gate oxide layer 170, and a second gate layer 820, where gate layer 175 is also referred to as first gate layer 175). The second gate structure includes a second gate oxide layer 810 (where gate oxide layer 170 is a first gate oxide layer 170) and a second gate layer 820 (where gate layer 175 is a first gate layer 175). In addition, LIGBT 800 includes a fourth N+-region 830 and a fifth N+-region 840.

As illustrated in FIG. 8, second gate oxide layer 810 and second gate layer 820 are disposed above second HVNW 122, and extend along the Y-direction illustrated in FIG. 8. Fourth N+-region 830 is disposed in second HVPD 132, adjacent to a right-side edge of first P+-region 181 and a left-side edge of second gate oxide layer 810. Fifth N+-region 840 is disposed in third HVPD 133, adjacent to a right-side edge of second gate oxide layer 810 and a left-side edge of second P+-region 182.

First gate layer 175 and second gate layer 820 are electrically connected to gate electrode 106 to receive a gate voltage. First P+-region 181 and fourth N+-region 830 are electrically connected to a second cathode electrode 104' (where cathode electrode 104 is a first cathode electrode 104) to receive a cathode voltage. Fifth N+-region 840 second P+-region 182, and first N+-region 191 are electrically connected to cathode electrode 104 to receive the cathode voltage.

When the anode voltage at anode electrode 108 is higher than the cathode voltage at cathode electrodes 104 and 104', a first hole current 800a flows from third P+-region 183, passes through P-body layer 152 and P-top layer 150, and reaches second P+-region 182. A second hole current 800b flows from third P+-region 183, passes through PBL 710, and reaches second P+-region 182. A first electron current 800c flows from first N+-region 191, passes through third HVNW 123, and reaches second N+-region 192. A second electron current 800d flows from fourth N+-region 830 and fifth N+-region 840, passes through second HVNW 122, NBL 720, and fourth HVNW 124, and reaches third N+-region 193.

Compared to LIGBT 100, the second gate structure of LIGBT 800 creates an additional channel in second HVNW 122 for conducting the second electron current 800d. As a result, the anode current increases compared to LIGBT 100, and the on-resistance of LIGBT 800 decreases.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor device, comprising:
  a substrate having a first conductivity type;
  a first doped well having a second conductivity type and disposed in the substrate;
  a second doped well having the first conductivity type and disposed in the substrate adjacent to a first side of the first doped well;
  a buffer region having the second conductivity type and disposed in the first doped well adjacent to a second and opposite side of the first doped well;
  a gate structure disposed above the first side of the first doped well and extending along a first horizontal direction;
  a first contact region having the first conductivity type and disposed in the buffer region toward the second side of the first doped well;
  a second contact region having the second conductivity type and disposed in the buffer region adjacent to the first contact region; and
  a doped region having the second conductivity type and disposed in the buffer region under the first contact region.

2. The semiconductor device of claim 1, wherein a first-side edge of the doped region extends beyond a first-side edge of the first contact region toward the second side of the first doped well along a second horizontal direction orthogonal to the first horizontal direction.

3. The semiconductor device of claim 2, wherein
  a distance between a second-side edge of the first contact region and a second-side edge of the doped region along the second horizontal direction is d,
  a width of the first contact region along the second horizontal direction is w, and
  the distance d is 30% to 70% of the width w.

4. The semiconductor device of claim 1, further including a body layer having the first conductivity type and disposed in the buffer region under the first contact region and the second contact region.

5. The semiconductor device of claim 1, further including:
  an isolation portion disposed above a portion the first doped well; and
  a top layer having the first conductivity type and disposed under the isolation portion.

6. The semiconductor device of claim 1, further including:
  an anode electrode electrically connected to the first contact region and the second contact region; and
  a gate electrode electrically connected to the gate structure.

7. The semiconductor device of claim 1, further including:
  a third contact region having the second conductivity type and disposed in the second doped well adjacent to the gate structure; and
  a fourth contact region having the first conductivity type and disposed in the second doped well adjacent to the third contact region.

8. The semiconductor device of claim 7, further including:
  a cathode electrode electrically connected to the third contact region and the fourth contact region.

9. The semiconductor device of claim 1, wherein
  the second contact region has a comb shape including a first portion extending along the first horizontal direction and a plurality of second portions spaced apart from each other and contiguous with the first portion, and
  the first contact region includes a plurality of portions disposed between the second portions of the second contact region.

10. The semiconductor device of claim 1, further including:
  a first buried layer having the first conductivity type and disposed below the first doped well and the second doped well; and
  a second buried layer having the second conductivity type and disposed below the first buried layer.

11. The semiconductor device of claim 1, wherein the gate structure is a first gate structure, the semiconductor device further including:
  a third doped well having the second conductivity type and disposed in the substrate, adjacent to the second doped well and spaced apart from the first doped well; and
  a second gate structure disposed above the third doped well.

12. The semiconductor device of claim 11, further including:
  a gate electrode electrically connected to the first gate structure and the second gate structure are connected to a gate electrode.

13. A semiconductor device, comprising:
  a substrate having a first conductivity type;
  a first doped well having a second conductivity type and disposed in the substrate;

a second doped well having the first conductivity type and disposed in the substrate adjacent to a first side of the first doped well;

a buffer region having the second conductivity type and disposed in the first doped well adjacent to a second and opposite side of the first doped well;

a gate structure disposed above the first side of the first doped well and extending along a first horizontal direction;

a first contact region having the first conductivity type and disposed in the buffer region toward the second side of the first doped well;

a second contact region having the second conductivity type and disposed in the buffer region adjacent to the first contact region, the second contact region having a comb shape including a first portion extending along the first horizontal direction and a plurality of second portions spaced apart from each other and contiguous with the first portion, and the first contact region including a plurality of portions disposed between the second portions of the second contact region; and a doped region having the second conductivity type and disposed in the buffer region under the first contact region.

14. The semiconductor device of claim 13, further including a body layer having the first conductivity type and disposed in the buffer region under the first contact region and the second contact region.

* * * * *